United States Patent
Nomura et al.

(10) Patent No.: US 12,356,538 B2
(45) Date of Patent: Jul. 8, 2025

(54) ELECTRONIC COMPONENT MODULE

(71) Applicant: Murata Manufacturing Co., Ltd., Kyoto-fu (JP)

(72) Inventors: Tadashi Nomura, Nagaokakyo (JP); Ryohei Okabe, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 387 days.

(21) Appl. No.: 18/165,582

(22) Filed: Feb. 7, 2023

(65) Prior Publication Data

US 2023/0189429 A1 Jun. 15, 2023

Related U.S. Application Data

(63) Continuation of application No. PCT/JP2021/023405, filed on Jun. 21, 2021.

(30) Foreign Application Priority Data

Aug. 20, 2020 (JP) .................. 2020-139543

(51) Int. Cl.
*H01L 23/552* (2006.01)
*H01L 23/544* (2006.01)
(Continued)

(52) U.S. Cl.
CPC ......... *H05K 1/0218* (2013.01); *H01L 23/544* (2013.01); *H01L 23/552* (2013.01); *H01L 25/16* (2013.01); *H05K 1/0269* (2013.01); *H05K 1/186* (2013.01); *H01L 2223/54413* (2013.01); *H01L 2223/54433* (2013.01); *H05K 2201/0715* (2013.01); *H05K 2201/0919* (2013.01);
(Continued)

(58) Field of Classification Search
CPC ............... H01L 23/552; H01L 2223/54413
See application file for complete search history.

(56) References Cited

U.S. PATENT DOCUMENTS

| 10,217,711 B2 | 2/2019 | Yoon et al. |
| 2011/0013349 A1 | 1/2011 | Morikita et al. |

(Continued)

FOREIGN PATENT DOCUMENTS

| JP | 2008258478 A | 10/2008 |
| JP | 2019-149466 A | 9/2019 |

(Continued)

OTHER PUBLICATIONS

International Search Report for PCT/JP2021/023405 dated Sep. 14, 2021.

*Primary Examiner* — Hung V Ngo
(74) *Attorney, Agent, or Firm* — McDonald Hopkins LLC

(57) ABSTRACT

A module includes a substrate, a component mounted on a top surface that is one principal surface of the substrate, a first shielding film provided on a top surface and a side surface of the component, a sealing resin provided on the top surface of the substrate and seals the component, and a second shielding film provided on a top surface of the sealing resin. A hole is provided on a top surface of the sealing resin, to reach at least a part of the first shielding film. The second shielding film disposed in the hole is brought into contact with the first shielding film at positions facing a top surface and a side surface of the component.

4 Claims, 7 Drawing Sheets

(51) Int. Cl.
*H01L 25/16* (2023.01)
*H05K 1/02* (2006.01)
*H05K 1/18* (2006.01)

(52) U.S. Cl.
CPC .............. *H05K 2201/09936* (2013.01); *H05K 2201/10015* (2013.01); *H05K 2201/10022* (2013.01); *H05K 2201/1003* (2013.01); *H05K 2201/1006* (2013.01); *H05K 2201/10522* (2013.01); *H05K 2201/10545* (2013.01)

(56) References Cited

U.S. PATENT DOCUMENTS

| | | | | |
|---|---|---|---|---|
| 2012/0211876 | A1* | 8/2012 | Huang | H01L 23/552 |
| | | | | 257/E23.114 |
| 2016/0358862 | A1* | 12/2016 | Lee | H01L 23/552 |
| 2019/0269046 | A1 | 8/2019 | Takizawa et al. | |
| 2020/0161259 | A1 | 5/2020 | Otsubo et al. | |
| 2021/0043583 | A1 | 2/2021 | Nomura et al. | |
| 2021/0076544 | A1 | 3/2021 | Umeda et al. | |
| 2022/0304201 | A1* | 9/2022 | Otsubo | H01L 23/3135 |
| 2022/0310317 | A1* | 9/2022 | Komiyama | H05K 3/4685 |
| 2023/0103130 | A1* | 3/2023 | Otsubo | H05K 1/185 |
| | | | | 361/748 |
| 2023/0144540 | A1* | 5/2023 | Oda | H05K 1/0216 |
| | | | | 361/818 |
| 2023/0163086 | A1* | 5/2023 | Komiyama | H05K 9/0084 |
| | | | | 257/728 |
| 2023/0200033 | A1* | 6/2023 | Okabe | H01L 25/18 |
| | | | | 361/816 |
| 2023/0225092 | A1* | 7/2023 | Komatsu | H05K 9/003 |
| | | | | 361/748 |

FOREIGN PATENT DOCUMENTS

| | | |
|---|---|---|
| WO | 2009/122835 A1 | 10/2009 |
| WO | 2018/181708 A1 | 10/2018 |
| WO | 2019/026902 A1 | 2/2019 |
| WO | 2019/216299 A1 | 11/2019 |
| WO | 2020/021981 A1 | 1/2020 |

* cited by examiner

ELECTRONIC COMPONENT MODULE

CROSS REFERENCE TO RELATED APPLICATION

This is a continuation of International Application No. PCT/JP2021/023405 filed on Jun. 21, 2021 which claims priority from Japanese Patent Application No. 2020-139543 filed on Aug. 20, 2020. The contents of these applications are incorporated herein by reference in their entireties.

BACKGROUND OF THE DISCLOSURE

Field of the Disclosure

The present disclosure relates to a module including an electronic component mounted on a substrate.

Description of the Related Art

Conventionally, as this type of module, for example, a module described in Patent Document 1 (U.S. Pat. No. 10,217,711) has been known. Patent Document 1 discloses a module that includes a component to be shielded covered by a shielding film for shielding electromagnetic waves and other components, and these components are mounted on one principal surface of a substrate and sealed by a sealing resin.

(Patent Document 1) U.S. Pat. No. 10,217,711

BRIEF SUMMARY OF THE DISCLOSURE

Based on the configuration disclosed in Patent Document 1, in order to prevent the other components from being affected by external electromagnetic waves, the present inventors have been developing a module including an additional shielding film that covers the sealing resin. In such a module, if grounding points of the existing shielding film and the additional shielding film have different potentials, parasitic capacitance is formed between the two shielding films. Such parasitic capacitance may cause the module to malfunction. Although the parasitic capacitance can be reduced by increasing the distance between the two shielding films, a reduction in the module height is obstructed. From this point of view, there is still room for improvement in the configuration of the module.

Therefore, a possible benefit of the present disclosure is to solve the problem described above, and to provide a module in which parasitic capacitance generated between two shielding films is reduced without obstructing the reduction in the module height.

In order to solve the problem, a module according to the present disclosure includes:
a substrate;
a component mounted on a top surface that is one principal surface of the substrate;
a first shielding film provided on a top surface and a side surface of the component;
a sealing resin provided on the top surface of the substrate and seals the component; and
a second shielding film provided on a top surface of the sealing resin, wherein
a hole is provided on a top surface of the sealing resin, to reach at least a part of the first shielding film, and
the second shielding film disposed in the hole is brought into contact with the first shielding film at positions facing a top surface and a side surface of the component.

According to the present disclosure, it is possible to reduce the parasitic capacitance generated between the two shielding films without obstructing the reduction in the module height.

DETAILED DESCRIPTION OF THE DISCLOSURE

Figure 1:
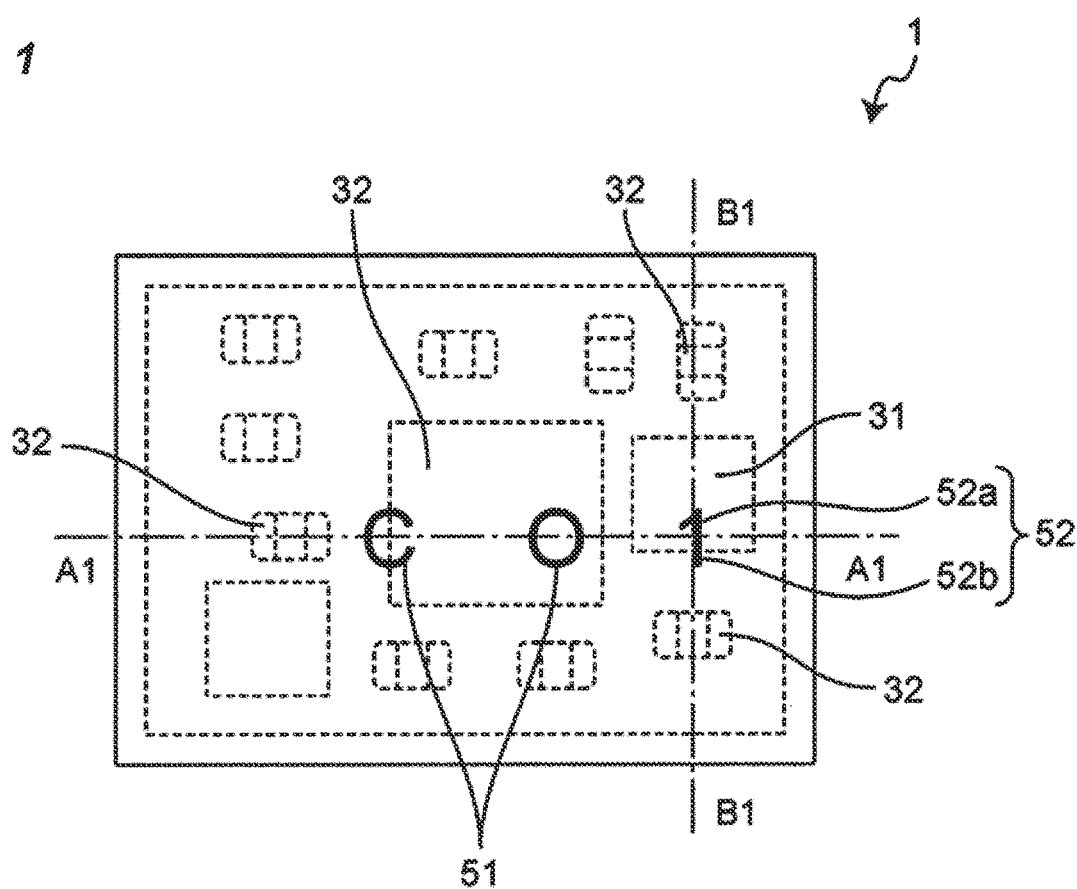
FIG. 1 is a plan view of a module according to a first embodiment of the present disclosure.

A module according to an aspect of the present disclosure includes:
a substrate;
a component mounted on a top surface that is one principal surface of the substrate;
a first shielding film provided on a top surface and a side surface of the component;
a sealing resin provided on the top surface of the substrate and seals the component; and
a second shielding film provided on a top surface of the sealing resin, wherein
a hole is provided on a top surface of the sealing resin, to reach at least a part of the first shielding film, and
the second shielding film disposed in the hole is brought into contact with the first shielding film at positions facing a top surface and a side surface of the component.

With this configuration, by bringing the second shielding film provided in the hole into contact with the first shielding film, the potential difference between the two shielding films can be reduced, and the parasitic capacitance can be reduced without obstructing the reduction in the module height. Therefore, it is possible to suppress malfunctions of the module caused by the parasitic capacitance. In addition, by bringing the second shielding film provided in the hole into contact with the first shielding film at positions facing the top surface and the side surface of the component, the surfaces on which the two respective shielding films are brought into contact with each other are extended. Therefore, the above-described effect can be achieved more reliably.

Preferably, the hole includes a first area overlapping with the top surface of the component and a second area not overlapping with the top surface of the component in a plan view of the sealing resin, and the second shielding film provided in the hole is brought into contact with the first shielding film at a position facing the top surface of the component, the position being inside the first area, and is brought into contact with the first shielding film at a position facing a side surface of the component, the position being inside the second area.

With this configuration, the second shielding film provided in the hole can be brought into contact with the first shielding film at positions facing the top surface and the side surface of the component.

In addition, preferably, a recess is provided on the top surface of the sealing resin, in a manner recessed toward the top surface of the substrate, and a depth of the hole is greater than a depth of the recess.

With this configuration, under the condition in which the recess casts a shadow making an identifier visible on the top surface of the sealing resin, the hole can be ensured with a depth sufficient to cast a shadow in the same manner, because the hole is deeper than the recess.

In addition, preferably, a recess is provided on the top surface of the sealing resin, in a manner recessed toward the top surface of the substrate, and the depths of the hole in the first area and the second area are greater than the depth of the recess.

With this configuration, under the condition in which the recess casts a shadow making an identifier visible on the top surface of the sealing resin, the first area and the second area can have a depth sufficient to cast a shadow in the same manner, because the hole has the first area and the second area that are deeper than the recess.

Preferably, each of the hole and the recess delineates an identifier including at least one of a character, a number, a symbol, a dot-shaped recognition code, a barcode, a two-dimensional code, a logo, and a graphic, in a plan view of the sealing resin.

With this configuration, the hole can also serve as a conventional indicating hole for indicating an identifier on the top surface of the sealing resin. Therefore, it is possible to use a conventional indicating hole to bring the second shielding film into contact with the first shielding film, and it is not necessary to provide a new manufacturing process.

Embodiments of the present disclosure will now be explained with reference to some drawings. The present disclosure is, however, not limited to the following embodiments. In the drawings, substantially the same members are denoted by the same reference numerals, and the explanations thereof will be omitted.

Hereinafter, for the convenience of descriptions, terms indicating directions such as "top surface", "bottom surface", and "side surface" are used, but these terms do not mean to limit how the module according to the present disclosure is used, for example.

First Embodiment

Figure 2:
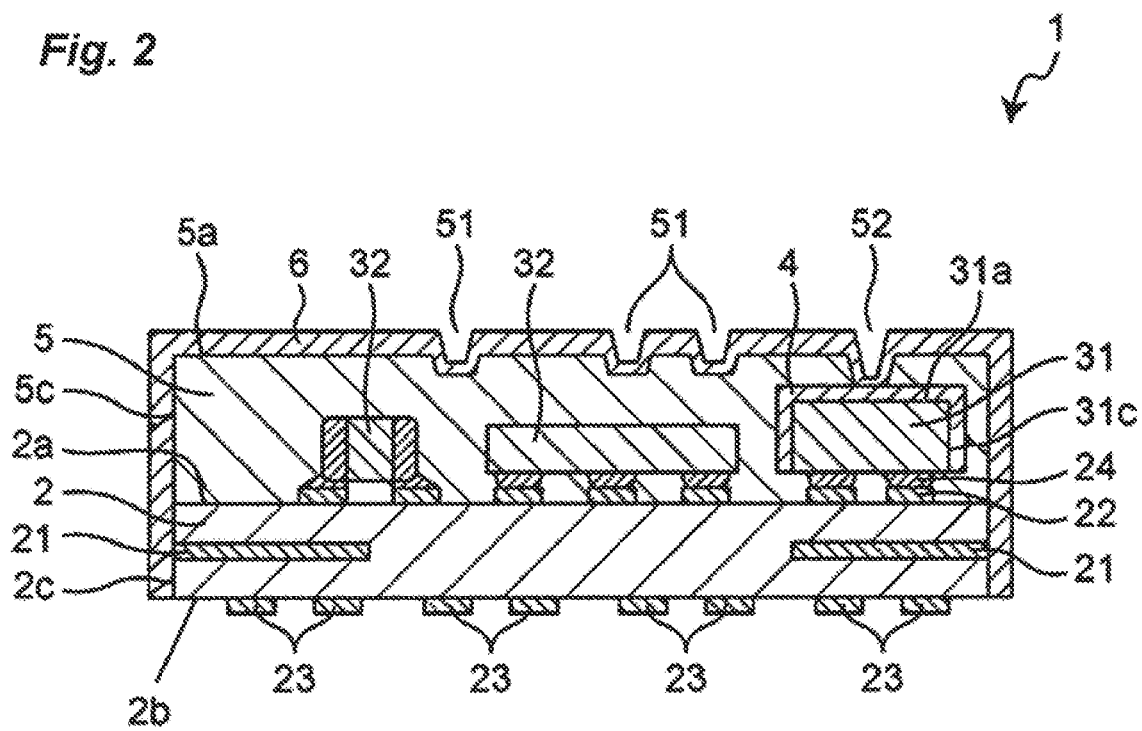
FIG. 2 is a cross-sectional view of the module taken along the line A1-A1 in FIG. 1.
Figure 3:
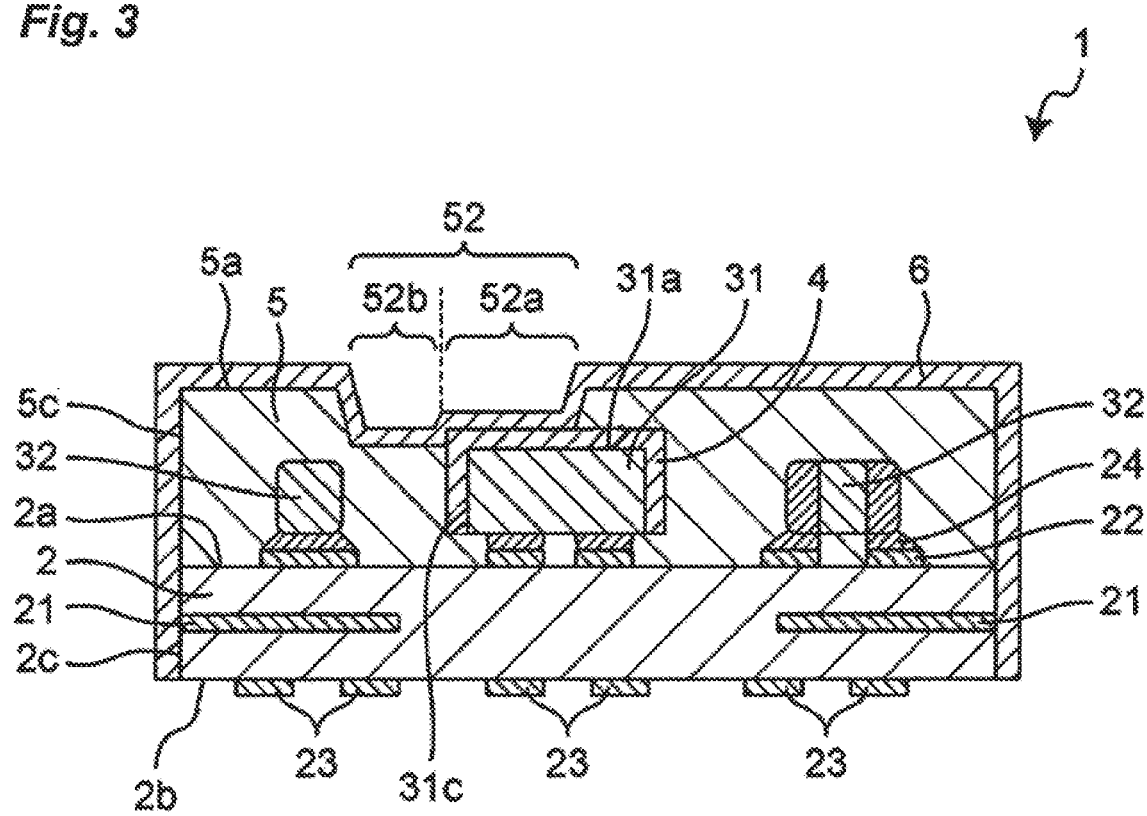
FIG. 3 is a cross-sectional view of the module illustrated in FIG. 1 B1-B1.
Figure 4:
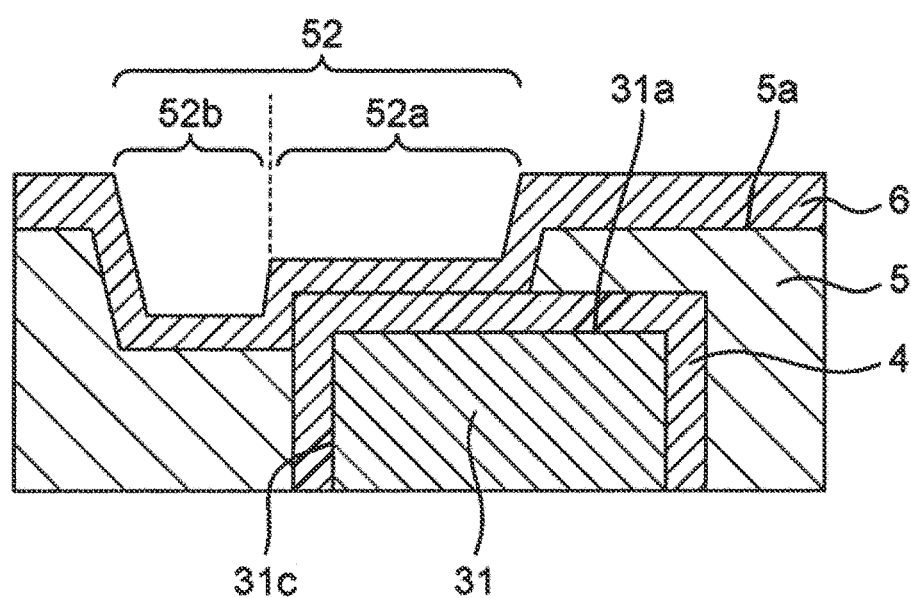
FIG. 4 is a partially enlarged view of FIG. 3.

A module according to a first embodiment of the present disclosure will now be explained with reference to FIGS. 1 to 4. FIG. 1 is a plan view of a module according to a first embodiment of the present disclosure. FIG. 2 is a cross-sectional view of the module taken along the line A1-A1 in FIG. 1. FIG. 3 is a cross-sectional view of the module taken along the line B1-B1 in FIG. 1. FIG. 4 is a partially enlarged view of FIG. 3.

A module 1 according to the present embodiment includes a substrate 2 and components 31 and 32 mounted on a top surface 2a that is one principal surface of the substrate 2. The components 31 and 32 are sealed by a sealing resin 5 provided on the top surface 2a of the substrate 2. The module 1 also includes an inner shielding film 4 that covers the top surface 31a and a side surface 31c of the component 31, and an outer shielding film 6 that covers a top surface 5a and a side surface 5c of the sealing resin 5 and a side surface 2c of the substrate 2.

As illustrated in FIG. 2, the substrate 2 has the top surface 2a that is one principal surface, a bottom surface 2b as the other principal surface, and a side surface 2c connecting outer peripheries of the top surface 2a and the bottom surface 2b. The substrate 2 may be either a single-layer substrate or a multi-layer substrate. The substrate 2 may be made of, for example, glass epoxy resin, low-temperature co-fired ceramic, or high-temperature co-fired ceramic.

Ground electrodes 21 are provided inside the substrate 2, to reach the side surfaces 2c of the substrate 2, respectively.

On the top surface 2a of the substrate 2, mounting electrodes 22 are provided. The components 31 and 32 are mounted on the mounting electrodes 22, respectively, with the solder bumps 24 therebetween. The components 31 and 32 may be, for example, a semiconductor element such as a resistor, a capacitor, an inductor, a filter, an integrated circuit, or a power amplifier. The filter is, for example, a surface acoustic wave filter, a bulk acoustic wave filter, or a ceramic LC filter. In the present embodiment, a plurality of types of components 32 are provided.

External electrodes 23 are provided on a bottom surface 2b of the substrate 2. The module 1 is mounted on, for example, a mother board (not illustrated) with the external electrodes 23 therebetween. The external electrodes 23 are electrically connected to the mounting electrodes 22 or the ground electrodes 21 inside the substrate 2. Therefore, power is supplied or a signal is transmitted to the components 31 and 32, via the external electrode 23. Alternatively, the external electrodes 23 are connected to an external ground potential (e.g., the ground potential of the mother board), to ground the components 31 and 32 and the ground electrode 21.

The ground electrodes 21, the mounting electrodes 22, and the external electrodes 23 may be made of a conductive material such as copper (Cu), silver (Ag), aluminum (Al), or a compound of these metals, for example. Nickel (Ni)/gold (Au) plating may be applied to the mounting electrodes 22 and the external electrodes 23.

The top surface 31a and the side surface 31c of the component 31 are covered by the inner shielding film 4 which is an example of a first shielding film. The inner shielding film 4 contains a conductive material, and shields electromagnetic waves.

The inner shielding film 4 may be formed by, for example, sputtering or vapor deposition. The film thickness of the inner shielding film 4 may be, for example, 2 μm or greater and less than 5 μm.

The inner shielding film 4 may have a multi-layer structure. For example, the inner shielding film 4 may have a conductive film laminated on the component 31, and an adhesive film laminated on the conductive film and being in contact with the sealing resin 5. The conductive film has a function of shielding electromagnetic waves, and may be made of, for example, copper (Cu), silver (Ag), or aluminum (Al). The adhesive film is provided to enhance adhesion between the sealing resin 5 and the conductive film, and may be made of, for example, titanium (Ti), chromium (Cr), or stainless steel (SUS).

The inner shielding film 4 shields electromagnetic waves radiated from the outside or from the component 32. Therefore, the component 31 is less affected by the electromagnetic waves radiated from the outside or from the component 32. Therefore, malfunctions of the component 31 can be suppressed. Furthermore, the inner shielding film 4 also shields electromagnetic waves radiated from the component 31. Therefore, the component 32 is affected less by the electromagnetic waves radiated from the component 31. Hence, it becomes also possible to suppress malfunctions of the component 32.

The components 31 and 32 are sealed by a sealing resin 5 provided on the top surface 2a of the substrate 2. The sealing resin 5 has an abutting surface that abuts against the top surface 2a of the substrate 2, a top surface 5a that is on the opposite side of the abutting surface, and a side surface 5c connecting the outer peripheries of the top surface 5a and the abutting surface.

The sealing resin 5 may be made of, for example, an epoxy resin. The sealing resin 5 may contain, for example, a filler such as silica filler or alumina.

The top surface 5a of the sealing resin 5 is provided with recesses 51 and a hole 52 all of which extend toward the substrate 2. The recesses 51 and the hole 52 are indicating holes for indicating an identifier on the top surface 5a of the sealing resin 5 by shadows casted by the shapes of the respective hole and recesses. In the present embodiment, as illustrated in FIG. 1, the recesses 51 have shapes of "C" and "O", respectively, and the hole 52 has a shape of "1".

The identifier may be, for example, a character, a number, a symbol, a dot-like recognition code, a barcode, a two-dimensional code, a logo, a graphic, or a combination thereof.

In a plan view (FIG. 1) in which the module 1 is viewed along the thickness direction of the substrate 2, the recesses 51 do not overlap with the component 31. By contrast, the hole 52 partially overlaps with the component 31. The hole 52 has a first area 52a overlapping with the top surface 31a of the component 31, and a second area 52b not overlapping with the top surface 31a.

As illustrated in FIG. 2, the recesses 51 have a depth sufficient for a shadow to be casted by its recessed shape, but does not reach the component 32. In addition, because the hole 52 is deeper than the recesses 51, the hole has a depth sufficient to cast a shadow by its hole shape.

As illustrated in FIGS. 3 and 4, the hole 52 reaches the inner shielding film 4 at positions facing the top surface 31a and the side surface 31c of the component 31.

In the present embodiment, the depth of the recesses 51 is 20 μm to 30 μm, and the depth of the hole 52 is 40 μm to 50 μm.

The hole 52 may be formed by, for example, removing the sealing resin 5 provided in the hole 52 with a laser. At this time, the inner shielding film 4 preferably contains a metal having a high reflectance with respect to the laser. For example, copper (Cu) and silver (Ag) have a high reflectance with respect to a laser at a wavelength of 1 μm or wider, and thus are less likely to be damaged by the laser. Therefore, the inner shielding film 4 contains at least one of a copper (Cu) layer and a silver (Ag) layer, so as to provide a function of shielding electromagnetic waves and to be less likely to be damaged by a laser.

When the module 1 includes such an inner shielding film 4, it is preferable for the laser for making the hole 52 to have an intensity capable of removing the sealing resin 5 provided in the first area 52a of the hole 52 sufficiently. In this manner, it becomes possible to remove the sealing resin 5 on the inner shielding film 4 more reliably. In addition, by forming the recesses 51 and the hole 52 continuously by the laser having the intensity described above, it becomes possible to make the second area 52b of the hole 52 deeper than the first area 52a. Therefore, as illustrated in FIGS. 3 and 4, a part of the side surface 31c of the component 31 becomes temporarily exposed from the sealing resin 5.

In addition, the recesses 51 may be formed using a laser having a weaker intensity than that used in forming the hole 52, for example.

As illustrated in FIGS. 2 and 3, the top surface 5a and the side surface 5c of the sealing resin 5 and the side surface 2c of the substrate 2 are covered by an outer shielding film 6 that is an example of a second shielding film. The outer shielding film 6 contains a conductive material, and shields electromagnetic waves. Therefore, the outer shielding film 6 is grounded by being brought into contact with the ground electrode 21 on the side surface 2c of the substrate 2.

The outer shielding film 6 may be formed by, for example, sputtering or vapor deposition. The film thickness of the outer shielding film 6 may be, for example, 2 μm or greater and less than 5 μm.

When the outer shielding film 6 is formed by sputtering, it is preferable for the side surfaces of the recesses 51 and the hole 52 to be inclined in such a manner that the recesses 51 and the hole 52 are converged toward their respective bottoms, as illustrated in FIGS. 2 to 4. In addition, when the recesses 51 and the hole 52 have a linear shape in a plan view (FIG. 1) of the module 1, it is preferable for the width of the linear shape to be thicker. By changing the shapes in this manner, the area of the opening of the recesses 51 or the hole 52 is increased. Therefore, the outer shielding film 6 is better deposited in the recesses 51 and the hole 52. Therefore, it becomes possible to suppress defective deposition of the outer shielding film 6 inside the recesses 51 or the hole 52. Furthermore, the outer shielding film 6 may have a greater film thickness inside the recesses 51 or the hole 52.

The outer shielding film 6 may have a multi-layer structure. For example, the outer shielding film 6 may include an adhesive film laminated on the sealing resin 5 or the substrate 2, a conductive film laminated on the adhesive film, and a protective film laminated on the conductive film. The adhesive film is provided to enhance adhesion between the sealing resin 5 or the substrate 2 and the conductive film, and may be made of, for example, titanium (Ti), chromium (Cr), or stainless steel (SUS). The conductive film has a function of shielding electromagnetic waves, and may be made of, for example, copper (Cu), silver (Ag), or aluminum (Al). The protective film is provided to protect the conductive film from corrosions, damages, and the like, and may be made of, for example, titanium (Ti), chromium (Cr), or stainless steel (SUS). Note that the inner shielding film 4 may also have a similar multi-layer structure.

The outer shielding film 6 shields electromagnetic waves radiated from the outside. Therefore, the components 31 and 32 are less likely to be affected by electromagnetic waves radiated from the outside. Therefore, malfunctions of the components 31 and 32 can be suppressed. Furthermore, the outer shielding film 6 also shields electromagnetic waves radiated from the components 31 and 32. Therefore, the components 31 and 32 are less likely to affect the outside with the electromagnetic waves. Hence, for example, when the module 1 is mounted on the mother board, it becomes possible to suppress malfunctions of other electronic components mounted on the mother board.

The outer shielding film 6 is in contact with the inner shielding film 4 at positions facing the top surface 31a and the side surface 31c of the component 31. Therefore, the potential difference between the outer shielding film 6 and the inner shielding film 4 becomes smaller. Hence, the parasitic capacitance between the outer shielding film 6 and the inner shielding film 4 is reduced.

In addition, the area of contact is increased, as compared with an example in which the inner shielding film 4 and the outer shielding film 6 are in contact only at a position facing the top surface 31a of the component 31. Furthermore, because the inner shielding film 4 and the outer shielding film 6 are in contact with each other on at least two different surfaces, the strength of the contact portion increases.

According to the present embodiment, by bringing the outer shielding film 6 provided in the hole 52 into contact with the inner shielding film 4, the potential difference between the two shielding films 4 and 6 can be reduced, and the parasitic capacitance can be reduced without obstructing the reduction in the module height. Therefore, it is possible to suppress malfunctions of the module 1 caused by the parasitic capacitance. In addition, by bringing the outer shielding film 6 provided in the hole 52 into contact with the inner shielding film 4 at positions facing the top surface 31a and the side surface 31c of the component 31, the surfaces on which the two respective shielding films 4 and 6 are brought into contact with each other are extended. Therefore, the above-described effect can be achieved more reliably.

According to the present embodiment, the outer shielding film 6 provided in the hole 52 can be brought into contact with the inner shielding film 4 at positions facing the top surface 31a and the side surface 31c of the component 31.

According to the present embodiment, under the condition in which the recess 51 casts a shadow making an identifier visible on the top surface 5a of the sealing resin 5, the hole 52 can be ensured with a depth sufficient to cast a shadow in the same manner, because the hole 52 is deeper than the recess 51.

According to the present embodiment, under the condition in which the recess 51 casts a shadow making an identifier visible on the top surface 5a of the sealing resin 5, the first area 52a and the second area 52b can have a depth sufficient to cast a shadow in the same manner, because the hole 52 has the first area 52a and the second area 52b that are deeper than the recess 51.

According to the present embodiment, the hole 52 can also serve as a conventional indicating hole for indicating an identifier on the top surface 5a of the sealing resin 5. Therefore, it is possible to use a conventional indicating hole to bring the outer shielding film 6 into contact with the inner shielding film 4, and it is not necessary to provide a new manufacturing process.

Second Embodiment

Figure 5:
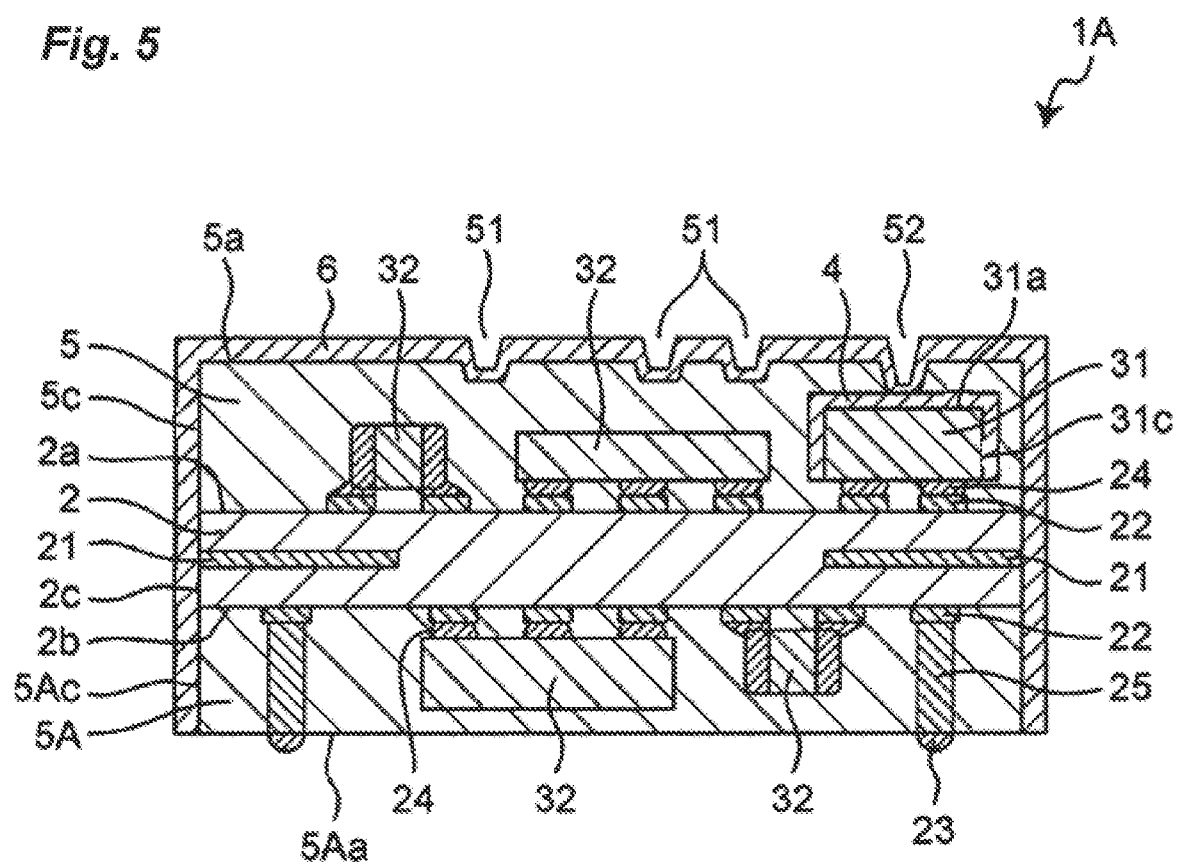
FIG. 5 is a cross-sectional view of a module according to a second embodiment of the present disclosure.

A module according to a second embodiment of the present disclosure will now be explained with reference to FIG. 5. FIG. 5 is a cross-sectional view of the module according to the second embodiment of the present disclosure.

The module 1A according to the second embodiment is different from the module 1 according to the first embodiment in that the component 32 is also mounted on the bottom surface 2b of the substrate 2. A configuration of the bottom surface 2b of the substrate 2 will be explained below.

In the second embodiment, the mounting electrodes 22 are provided on the bottom surface 2b of the substrate 2.

In the present embodiment, the component 32 or columnar electrodes 25 are mounted on the mounting electrodes 22, respectively, with the solder bumps 24 therebetween. The columnar electrodes 25 may be also plated on the mounting electrode 22 directly, without the solder bumps 24 interposed therebetween.

The components 32 are sealed by a sealing resin 5A provided on the bottom surface 2b of the substrate 2. The sealing resin 5A has an abutting surface that abuts against the bottom surface 2b of the substrate 2, a bottom surface 5Aa that is on the opposite side of the abutting surface, and a side surface 5Ac connecting the outer peripheries of the bottom surface 5Aa and the abutting surface. In the same manner as the sealing resin 5, the sealing resin 5A may be made of an epoxy resin, for example.

The columnar electrodes 25 extend in a direction moving away from the bottom surface 2b of the substrate 2. Ends of the columnar electrodes 25 on the opposite side of the substrate 2 reaches the bottom surface 5Aa of the sealing resin 5A. The columnar electrode 25 may be made of a conductive material such as copper (Cu), silver (Ag), aluminum (Al), or a compound of these metals.

External electrodes 23 connected to the respective columnar electrodes 25 are provided on the bottom surface 5Aa of the sealing resin 5A. Each of the columnar electrodes 25 transmits power or a signal applied to corresponding one of the mounting electrode 22 and the external electrode 23 that are connected to respective ends of the columnar electrodes 25 to the other end.

The top surface 5a and the side surface 5c of the sealing resin 5, the side surface 2c of the substrate 2, and the side surface 5Ac of the sealing resin 5A are covered by the outer shielding film 6.

According to the present embodiment, the component 32 may also be mounted on the bottom surface 2b, in addition to the top surface 2a of the substrate 2. Therefore, the number of components that can be mounted on a fixed area of the substrate 2 is increased. In this manner, the size of the module 1A can be reduced.

Third Embodiment

Figure 7:
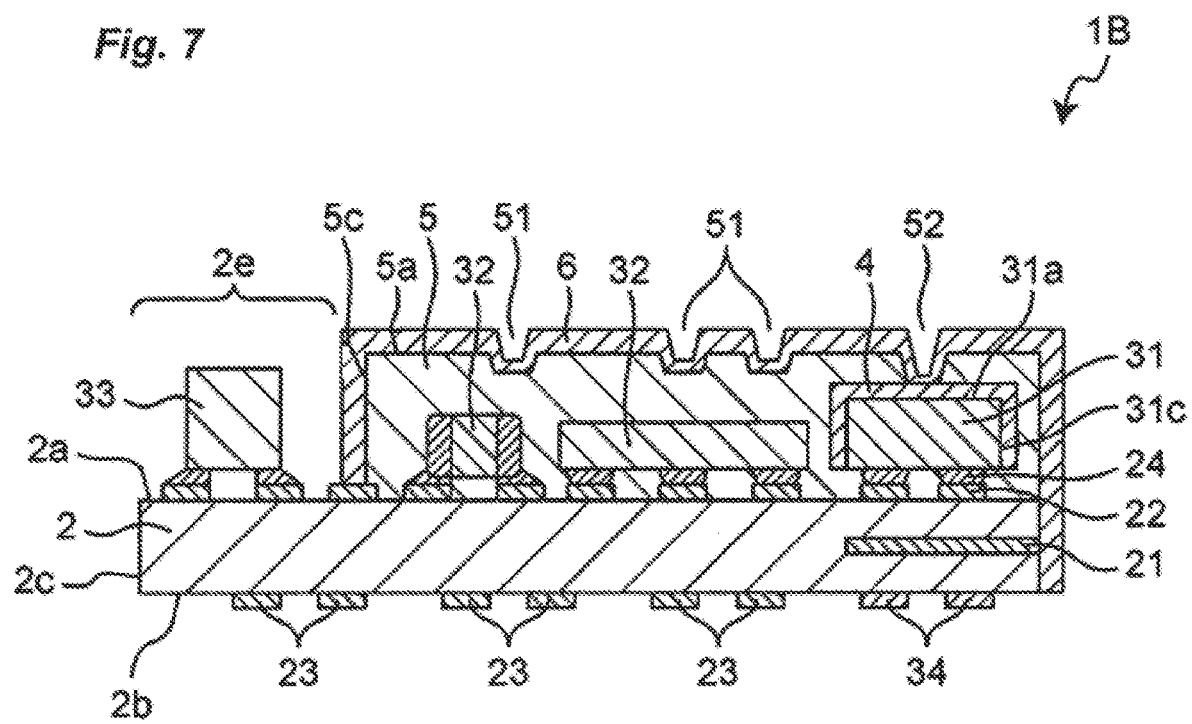
FIG. 7 is a cross-sectional view of a module according to a third embodiment of the present disclosure.

A module according to a third embodiment of the present disclosure will now be explained with reference to FIG. 7. FIG. 7 is a cross-sectional view of the module according to the third embodiment of the present disclosure.

The module 1B according to the third embodiment is different from the module 1 according to the first embodiment in that the substrate 2 is extended, and that antennas 34 are provided.

In the third embodiment, the substrate 2 is extended in a planar direction of the substrate. In the present specification, an additional area increased by extending the top surface 2a of the substrate 2 will be referred to as an extended area 2e.

A mounting electrode 22 is provided in the extended area 2e of the substrate 2. The component 33 is mounted on the mounting electrode 22 provided in the extended area 2e, with the solder bumps 24 therebetween. The component 33 is not sealed by the sealing resin 5, and is exposed on the top surface 2a of the substrate 2.

The component 33 may be, for example, a semiconductor element such as a resistor, a capacitor, an inductor, a filter, an integrated circuit, or a power amplifier. In the present embodiment, the component 33 is a connector for external connection.

In a cross-sectional view (FIG. 7) of the module 1B, at least one end of the outer shielding film 6 is connected to the mounting electrode 22. The mounting electrode 22 connected to the outer shielding film 6 may be, for example, a mounting electrode 22 for grounding, the mounting electrode 22 being connected to the ground potential of the mother board.

Antennas 34 for transmitting and receiving radio waves are provided on the bottom surface 2b of the substrate 2. For example, various types of antennas such as dipole antennas and patch antennas may be used as the antennas 34. Furthermore, the antennas 34 may have a configuration in which a plurality of independent antennas are provided. For example, all of the external electrodes 23 illustrated in FIG. 7 may be replaced with a plurality of independent antennas 34.

With the antenna 34 provided, the module 1B may function as a wireless LAN module, a Bluetooth (registered trademark) module, or an antenna module, for example.

According to the present embodiment, because the component 33 is a connector for external connection and is exposed on the top surface 2a of the substrate 2, it is possible to ensure an external connection. In addition, with the antennas 34 provided, the module 1B may also have a wireless communication function.

Note that the present disclosure is not limited to the embodiments described above, and may also be implemented in various other modes. For example, in the above description, the components 31, 32, and 33 may be a resistor, a capacitor, an inductor, a filter, a semiconductor element such as an integrated circuit or a power amplifier, but the present disclosure is not limited thereto. For example, the components 31, 32, and 33 may be submodules on which a plurality of components are mounted.

In the description above, the components 31, 32, and 33 are mounted on the mounting electrodes 22 with the solder bumps 24 therebetween, but the present disclosure is not limited thereto. For example, the components 31, 32, and 33 may be mounted on the mounting electrode 22 with a conductive adhesive, a conductive paste, or the like therebetween.

In the above description, the outer shielding film 6 is grounded by being brought into contact with the ground electrode 21 on the side surface 2c of the substrate 2, but the present disclosure is not limited thereto. For example, the outer shielding film 6 may be grounded by being electrically connected to the ground electrode 21 on the top surface 5a of the sealing resin 5, via a grounding member mounted on the top surface 2a of the substrate 2.

In the above description, the outer shielding film 6 covers the top surface 5a of the sealing resin 5, the side surfaces 5c, 5Ac of the sealing resin 5, 5A, and the side surface 2c of the substrate 2, but the present disclosure is not limited thereto. For example, the outer shielding film 6 may cover only the top surface 5a of the sealing resin 5, as long as the outer shielding film 6 is grounded.

Figure 6:
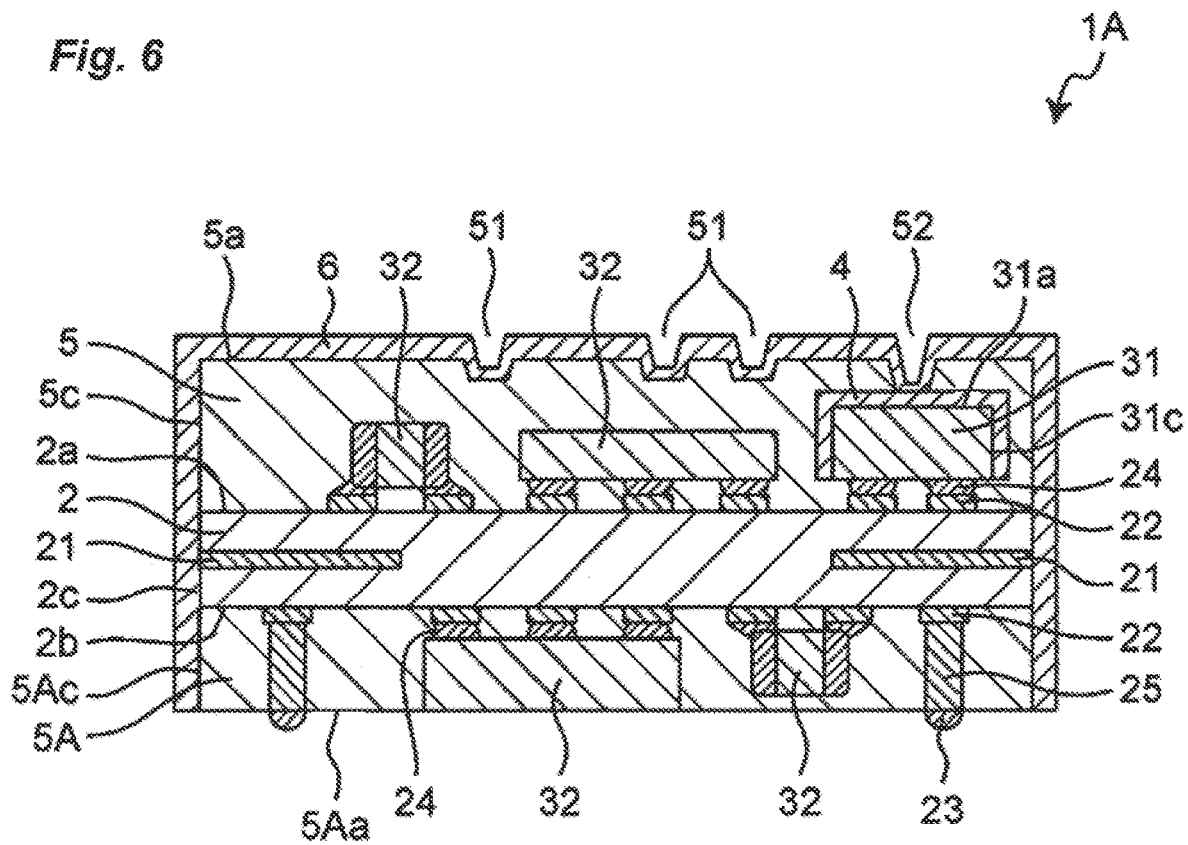
FIG. 6 is a cross-sectional view of a module according to the second embodiment of the present disclosure.

In the second embodiment, the component 32 mounted on the bottom surface 2b of the substrate 2 is sealed by the sealing resin 5A, but the present disclosure is not limited thereto. For example, as illustrated in FIG. 6, the component 32 may be partially exposed to the bottom surface 5Aa of the sealing resin 5A.

In the third embodiment, the substrate 2 is extended in one direction, but the present disclosure is not limited thereto. For example, the substrate 2 may be radially extended.

In the third embodiment, the antennas 34 are provided on the bottom surface 2b of the substrate 2, but the present disclosure is not limited thereto. For example, the antennas 34 may be provided in the extended area 2e of the substrate 2.

Note that by using an appropriate combination of any of the embodiments, it is possible to achieve the advantageous effects corresponding thereto.

Although the present disclosure has been fully described in connection with the preferred embodiments thereof with reference to the accompanying drawings, it is to be noted that various changes and modifications are apparent to those skilled in the art. Such variations and modifications are to be understood as falling within the scope of the present disclosure, as set forth in the appended claims.

With the module according to the present disclosure, because the parasitic capacitance generated between the two shielding films can be reduced, without obstructing a reduction in the module height, the module is useful as a module including two or more shielding films overlapping with each other in the thickness direction of the substrate.

1, 1A, 1B module
2 substrate
2a top surface
2b bottom surface
2c side surface
2e extended area
4 inner shielding film
5, 5A sealing resin
5a top surface
5c side surface
5Aa bottom surface
5Ac side surface
6 outer shielding film
21 ground electrode
22 mounting electrode
23 external electrode
24 solder bump
25 columnar electrode
31, 32, 33 component
31a top surface
31c side surface
34 antenna
51 recess
52 hole
52a first area
52b second area

The invention claimed is:

1. A module comprising:
a substrate;
a component mounted on a top surface being one principal surface of the substrate;
a first shielding film provided on a top surface and a side surface of the component;
a sealing resin provided on the top surface of the substrate and sealing the component; and
a second shielding film provided on a top surface of the sealing resin, wherein
a hole is provided on the top surface of the sealing resin to reach at least a part of the first shielding film,
the second shielding film disposed in the hole is brought into contact with the first shielding film at positions facing the top surface and the side surface of the component,
a recess is provided on the top surface of the sealing resin in a manner recessed toward the top surface of the substrate,
a depth of the hole is greater than a depth of the recess, and
each of the hole and the recess delineates an identifier including at least one of a character, a number, a symbol, a dot-shaped recognition code, a barcode, a two-dimensional code, a logo, and a graphic, in a plan view of the sealing resin.

2. A module according to claim 1, wherein
the hole includes a first area overlapping with the top surface of the component and a second area not overlapping with the top surface of the component in a plan view of the sealing resin, and the second shielding film provided in the hole is brought into contact with the first shielding film at a first position facing the top surface of the component, the first position being inside the first area, and is brought into contact with the first shielding film at a second position facing the side surface of the component, the second position being inside the second area.

3. A module according to claim 2, wherein each of the depths of the hole in the first area and the second area is greater than the depth of the recess.

4. A module comprising:
a substrate;
a component mounted on a top surface being one principal surface of the substrate;
a first shielding film provided on a top surface and a side surface of the component;
a sealing resin provided on the top surface of the substrate and sealing the component; and
a second shielding film provided on a top surface of the sealing resin, wherein
a hole is provided on the top surface of the sealing resin to reach at least a part of the first shielding film,
the hole includes a first area overlapping with the top surface of the component and a second area not overlapping with the top surface of the component in a plan view of the sealing resin,
the second shielding film provided in the hole is brought into contact with the first shielding film at a first position facing the top surface of the component, the first position being inside the first area, and is brought into contact with the first shielding film at a second position facing the side surface of the component, the second position being inside the second area,
a recess is provided on the top surface of the sealing resin in a manner recessed toward the top surface of the substrate,
each of depths of the hole in the first area and the second area is greater than a depth of the recess, and
each of the hole and the recess delineates an identifier including at least one of a character, a number, a symbol, a dot-shaped recognition code, a barcode, a two-dimensional code, a logo, and a graphic, in a plan view of the sealing resin.

\* \* \* \* \*